(12) United States Patent
Idei (10) Patent No.: US 8,618,562 B2
(45) Date of Patent: Dec. 31, 2013

(54) LIGHT EMITTING DEVICE AND METHOD FOR MANUFACTURING SAME

(75) Inventor: Yasuo Idei, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 130 days.

(21) Appl. No.: 12/563,562

(22) Filed: Sep. 21, 2009

(65) Prior Publication Data

US 2010/0289046 A1 Nov. 18, 2010

(30) Foreign Application Priority Data

May 14, 2009 (JP) .................................. 2009-117950

(51) Int. Cl.
*H01L 33/00* (2010.01)

(52) U.S. Cl.
USPC ................................. 257/98; 257/79; 257/94

(58) Field of Classification Search
USPC ........ 257/79, 98, E33.068, 94, 103, E33.008, 257/E33.013, E33.055
See application file for complete search history.

(56) References Cited

U.S. PATENT DOCUMENTS

| 6,221,683 | B1 | 4/2001 | Nirschl et al. |
| 6,319,778 | B1 | 11/2001 | Chen et al. |
| 6,759,689 | B2 | 7/2004 | Adomi et al. |
| 7,732,301 | B1 * | 6/2010 | Pinnington et al. ............ 438/455 |
| 2006/0043387 | A1 * | 3/2006 | Hata .............................. 257/79 |
| 2007/0141807 | A1 | 6/2007 | Ando et al. |
| 2007/0194325 | A1 | 8/2007 | Sung et al. |
| 2007/0292978 | A1 | 12/2007 | Yeh et al. |
| 2008/0267238 | A1 * | 10/2008 | Takeuchi et al. ......... 372/46.012 |
| 2009/0224269 | A1 | 9/2009 | Saeki et al. |

FOREIGN PATENT DOCUMENTS

| JP | H6-131715 A | 1/1994 |
| JP | 2001-244503 | 7/2001 |
| JP | 2005-109207 | 4/2005 |
| JP | 2006-310657 | 9/2006 |
| JP | 2007-173281 A | 7/2007 |
| JP | 2007-173282 A | 7/2007 |
| JP | 2009-10215 A | 1/2009 |

OTHER PUBLICATIONS

Taiwanese Office Action for Taiwanese Patent Application No. 098141363 mailed Dec. 10, 2012.
Japanese Office Action for Japanese Patent Application No. 2009-117950 mailed Oct. 3, 2012.
Japanese Office Action issued on Jun. 12, 2013 in the counterpart Japanese patent application No. 2009-117950, an English translation thereof.

* cited by examiner

*Primary Examiner* — Tran Tran
(74) *Attorney, Agent, or Firm* — White & Case LLP (57) ABSTRACT

A light emitting device includes: a multilayer body including a light emitting layer made of a semiconductor; a first bonding metal layer attached to the multilayer body; a substrate; and a second bonding metal layer attached to the substrate and bonded to the first bonding metal layer at a bonding interface, at least one of a planar size of the first bonding metal layer on the bonding interface side and a planar size of the second bonding metal layer on the bonding interface side being smaller than a planar size of the substrate.

18 Claims, 6 Drawing Sheets

LIGHT EMITTING DEVICE AND METHOD FOR MANUFACTURING SAME

CROSS-REFERENCE TO RELATED APPLICATIONS

This application is based upon and claims the benefits of priorities from the prior Japanese Patent Application No. 2009-117950, filed on May 14, 2009; the entire contents of which are incorporated herein by reference.

BACKGROUND OF THE INVENTION

1. Field of the Invention

This invention relates to a light emitting device and a method for manufacturing the same.

2. Background Art

Demand for light emitting devices is growing in such applications as illumination apparatuses, display apparatuses, and traffic signals. In these applications, high brightness, high reliability, and mass productivity are increasingly required of light emitting devices.

A light emitting layer made of InGaAlP-based semiconductor can provide emitted light in green to red wavelength range. A lattice constant of InGaAlP-based semiconductor has a small mismatch with a lattice constant of GaAs. Hence, use of a GaAs substrate for crystal growth of a multilayer body including the light emitting layer facilitates reducing crystal defects and increasing the reliability.

On the other hand, a bandgap wavelength of GaAs is longer than a wavelength of green to red visible light. Hence, the emitted light is absorbed, which results in brightness decrease. To reduce absorption in the substrate while reducing crystal defects, a wafer bonding process is used to transfer the multilayer body including the light emitting layer onto another substrate. In this structure, the substrate can be made of silicon, and the emitted light can be reflected by a bonding metal layer. This facilitates increasing volume productivity and bonding strength while increasing the light extraction efficiency.

JP-A-2005-109207 (Kokai) discloses an example of a method for manufacturing a light emitting device in which a device substrate and a compound semiconductor layer are reliably laminated via a metal layer. In this example, temperature raising of the wafers is started at a timing lagging behind the start of pressurizing the joined wafers, thereby avoiding cracks around the bonding metal layer.

However, the mass productivity of cutting process for dicing the thick bonding metal layer thus formed is not sufficiently high, and the yield also requires improvement.

SUMMARY OF THE INVENTION

According to an aspect of the invention, there is provided a light emitting device, including: a multilayer body including a light emitting layer made of a semiconductor; a first bonding metal layer attached to the multilayer body; a substrate; and a second bonding metal layer attached to the substrate and bonded to the first bonding metal layer at a bonding interface, at least one of a planar size of the first bonding metal layer on the bonding interface side and a planar size of the second bonding metal layer on the bonding interface side being smaller than a planar size of the substrate.

According to another aspect of the invention, there is provided a light emitting device, including: forming a multilayer body including a light emitting layer on a crystal growth substrate; forming a first bonding metal layer on the multilayer body; forming a second bonding metal layer on a substrate; bonding the first bonding metal layer and the second bonding metal layer by heating them in a joined state after forming a recess in at least one of a surface of the first bonding metal layer and a surface of the second bonding metal layer; removing the crystal growth substrate after the bonding; and cutting the substrate so that a plane passing in the recess and being generally perpendicular to the substrate constitutes a cutting plane.

According to another aspect of the invention, there is provided a light emitting device, including: forming a multilayer body including a light emitting layer on a crystal growth substrate; forming a first bonding metal layer on the multilayer body; forming a second bonding metal layer on a substrate; bonding the first bonding metal layer and the second bonding metal layer by heating them in a joined state after forming a recess in at least one of a surface of the first bonding metal layer and a surface of the second bonding metal layer; removing the crystal growth substrate after the bonding; separating the multilayer body from each other by providing a spacing region continuous to the recess; and cutting the substrate so that a plane passing in the spacing region of the multilayer body and the recess and being generally perpendicular to the substrate constitutes a cutting plane.

DETAILED DESCRIPTION OF THE INVENTION

Embodiments of the invention will now be described with reference to the drawings.

Figure 1A:
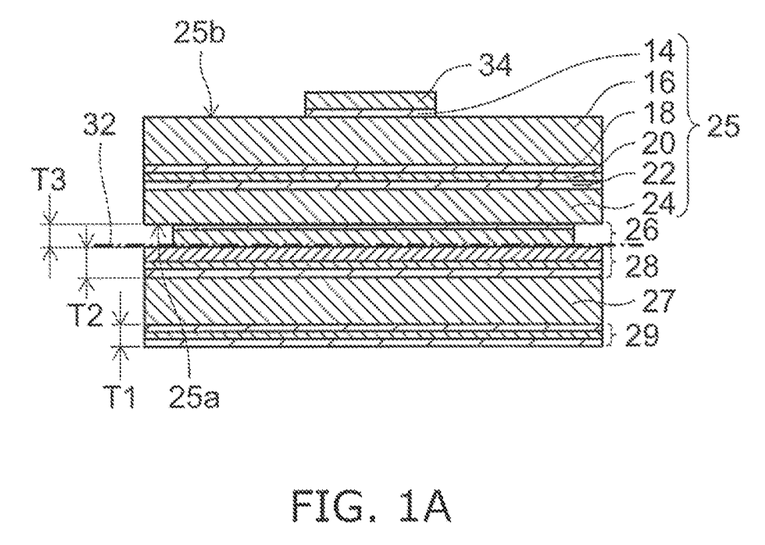
FIG. 1A is a schematic cross-sectional view of a light emitting device having a smaller first bonding metal layer according to a first embodiment and FIG. 1B is a schematic cross-sectional view of a light emitting device having a smaller second bonding metal layer according to a first embodiment
Figure 1B:
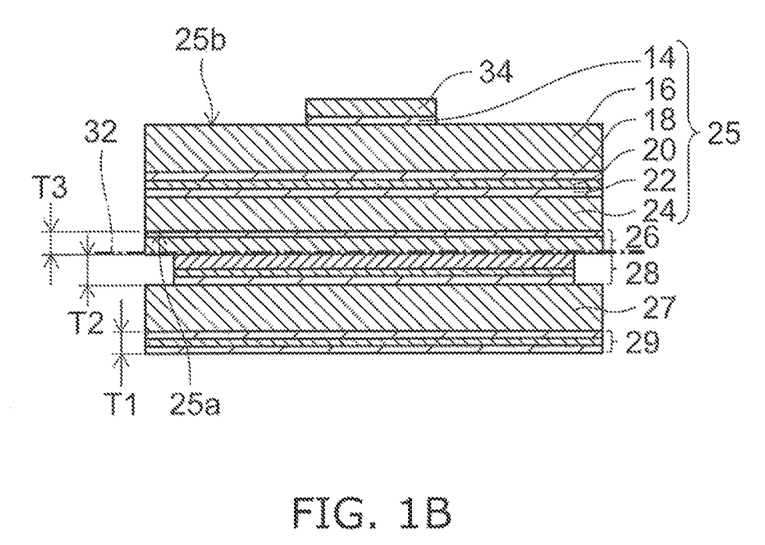

FIG. 1 is a schematic cross-sectional view of a light emitting device according to a first embodiment.

A multilayer body 25 including a light emitting layer 20 made of semiconductor is bonded to a substrate 27 via a bonding metal layer. More specifically, a first bonding metal layer 26 attached to one surface 25a of the multilayer body 25 and a second bonding metal layer 28 attached to the substrate 27 are bonded at a bonding interface 32. The second bonding metal layer 28 is connected to a p-side electrode 29 through the substrate 27 which is conductive.

The other surface 25b of the multilayer body 25 is connected to an n-side electrode 34 through an n-type contact layer 14, for instance. Thus, a current is injected into the light emitting layer 20, and emitted light with a wavelength corresponding to a bandgap wavelength of the light emitting layer 20 is emitted.

In this figure, the multilayer body 25 includes an n-type contact layer 14, an n-type current diffusion layer 16, an n-type cladding layer 18, a light emitting layer 20, a p-type cladding layer 22, and a p-type contact layer 24 from the n-side electrode 34 side, and is illustratively made of InGaAlP-based materials.

In this specification, the "InGaAlP-based material" refers to a material represented by a composition formula $In_x(Ga_yAl_{1-y})_{1-x}P$ (where $0 \leq x \leq 1$, $0 \leq y \leq 1$), and also includes those doped with p-type or n-type impurities. In this case, the emitted light can be in the wavelength range from green to red.

Alternatively, the multilayer body 25 can be made of materials represented by a composition formula $B_xIn_yGa_zAl_{1-x-y-z}N$ (where $0 \leq x \leq 1$, $0 \leq y \leq 1$, $0 \leq z \leq 1$, $x+y+z \leq 1$). In this case, the emitted light can be in the wavelength range from ultraviolet to green.

The second bonding metal layer 28 can have a smaller planar size than the substrate 27 as shown in FIG. 1B. Preferably, the first bonding metal layer 26 has a smaller planar size than the substrate 27 as shown in FIG. 1A, and larger thickness, because this facilitates reducing the stress applied to the light emitting layer 20 and increasing the reliability.

Figure 2A:
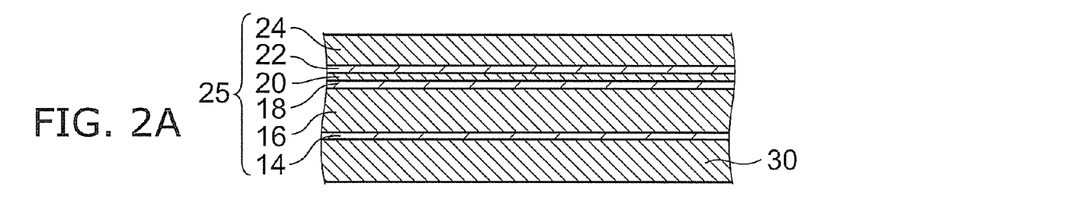
FIGS. 2A to 2C are process cross-sectional views of a method for manufacturing the light emitting device of the first embodiment.
Figure 2B:
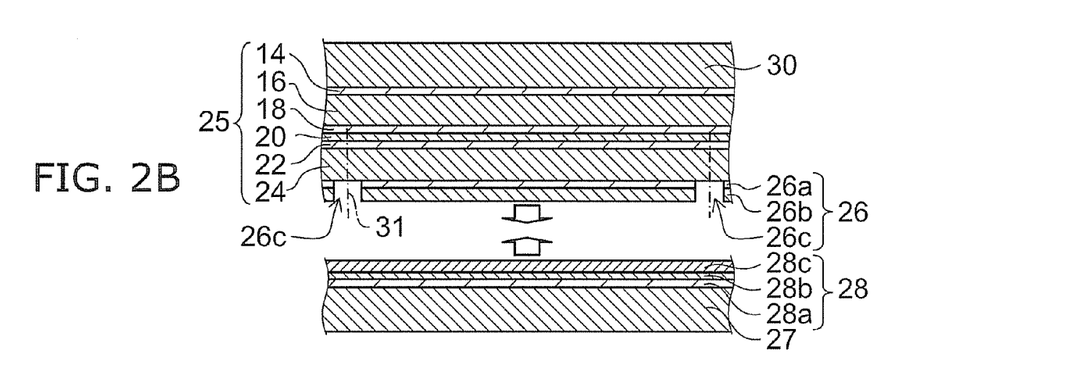
Figure 2C:
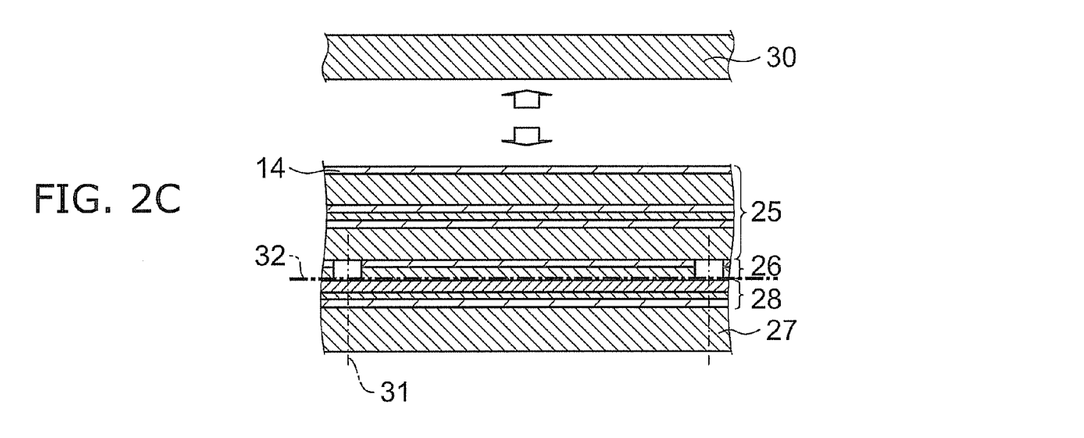

FIGS. 2A, 2B, and 2C are process cross-sectional views of a method for manufacturing a light emitting device according to the first embodiment.

On a crystal growth substrate 30 illustratively made of GaAs, a GaAs buffer layer (not shown), an n-type GaAs contact layer 14 ($1 \times 10^{18}$ cm$^{-3}$, thickness 0.1 μm), a current diffusion layer 16 made of n-type $In_{0.5}(Ga_{0.3}Al_{0.7})_{0.5}P$ ($4 \times 10^{17}$ cm$^{-3}$, thickness 2 μm), an n-type cladding layer 18 made of n-type InAlP ($4 \times 10^{17}$ cm$^{-3}$, thickness 0.6 μm), a light emitting layer 20, a p-type cladding layer 22 made of InAlP ($2 \times 10^{17}$ cm$^{-3}$, thickness 0.6 μm), a layer made of p-type $In_{0.5}(Ga_{0.3}Al_{0.7})_{0.5}P$, an $In_{0.5}(Ga_{0.7}Al_{0.3})_{0.5}P$ layer, a p-type contact layer 24 made of p-type $Ga_{0.5}Al_{0.5}As$ ($9 \times 10^{18}$ cm$^{-3}$, thickness 0.4 μm), a stopper layer made of n-type InAlP (not shown) and the like are crystal grown in this order illustratively by the MOCVD (metal organic chemical vapor deposition) method (FIG. 2A).

The light emitting layer 20 has a p-type MQW (multi-quantum well) structure at a concentration of $1 \times 10^{17}$ cm$^{-3}$, where the well layer can be made of $In_{0.5}(Ga_{0.94}Al_{0.06})_{0.5}P$ having a width of 10 nm, and the barrier layer can be made of $In_{0.5}(Ga_{0.4}Al_{0.6})_{0.5}P$ having a width of 20 nm. The number of well layers is illustratively 20. Then, red light with a peak wavelength of generally 624 nm and a dominant wavelength of generally 615 nm can be obtained.

As a preprocess for evaporation, the stopper layer is removed from the frontside of the wafer after crystal growth. Subsequently, on the exposed p-type contact layer 24, an Au (thickness 0.05 μm)/AuZn (containing 0.3% Zn, thickness 0.2 μm) film 26a and an Au (thickness 0.6 μm) film 26b are formed in this order to constitute a first bonding metal layer 26. In this process, by the lift-off process or the like, a recess 26c is formed in the surface of the first bonding metal layer 26 in a region which will serve later as a dicing region (FIG. 2B). A position of a center line 31 of the recess 26c defines the chip size. Here, the Au film 26b can be made of Au-containing eutectic solder, such as AuSn, AuGe, and AuSi. Then, even if the surface flatness is decreased, contact between wafers can be increased, and high bonding strength can be achieved.

On the other hand, on one surface of a mirror-polished, (100)-oriented substrate 27 illustratively made of p-type Si ($1 \times 10^{19}$ cm$^{-3}$, thickness 200 μm), a second bonding metal layer 28 made of Ti (0.1 μm)/Pt (0.12 μm)/Au (0.2 μm) is formed illustratively by evaporation. The first bonding metal layer 26 and the second bonding metal layer 28 are joined, and bonded by heating at 300° C. while pressurizing them in a vacuum (FIG. 2B).

Furthermore, the crystal growth substrate 30 is removed by etching. Subsequently, by sintering at 400° C., for instance, the bonding strength at the interface between the Au films can be further increased.

Next, the GaAs buffer layer and the like are removed to expose the n-type contact layer 14 (FIG. 2C). The lift-off process or the like is used to form an n-side electrode 34 illustratively made of AuGe (containing 3% Ge, 50 nm)/Au (100 nm)/Mo (150 nm)/Au (150 nm)/Mo (50 nm)/Au (600 nm). Furthermore, a p-side electrode 29 is formed on a backside of the substrate 27.

Next, from the substrate 27 side, for instance, a scribe groove is made at a position generally on the center line 31 of the recess 26c. Furthermore, from the frontside of the multilayer body 25 opposite to the scribe groove, by pressing a scribing cut edge or the like against the position corresponding to the scribe groove, chips can be reliably separated. Alternatively, dicing can be performed using a dicing blade.

If the first bonding metal layer 26 is continuous and has no recess, scribing or dicing may cause bends and curls from the multilayer body 25 near the cut portion of the first bonding metal layer 26. Such deformation occurring in the bonding metal layer 26 may cause cracks and the like in the multilayer body 25 including the light emitting layer 20.

In this embodiment, the sublayer of the first bonding metal layer 26 to be joined with the second bonding metal layer 28 is an Au layer 26b, and its thickness is increased. Thus, the bonding strength can be increased. When recess 26c is not formed, cutting the thick Au layer 26b results in increasing bends and curls at the end portion of the bonding metal layer and the multilayer body 25. However, in this embodiment, there is no need to cut a thick bonding metal layer, and such deformation can be reduced.

Next, the dependence of chip visual yield on metal layer thickness is described.

Figure 3A:
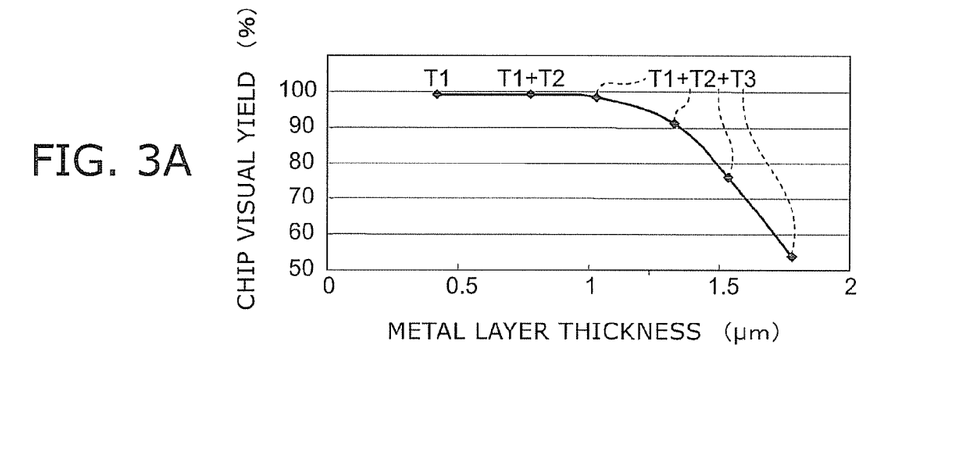
FIGS. 3A and 3B are graphs showing chip visual yield.
Figure 3B:
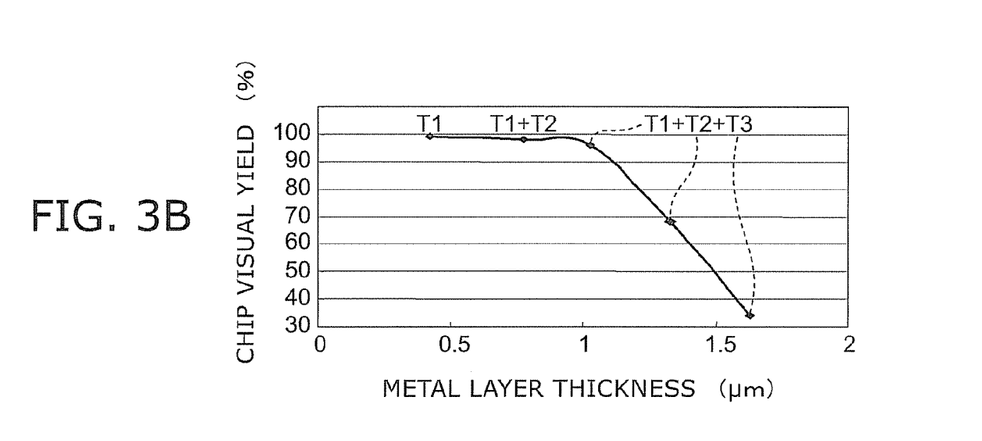

FIG. 3A is a graph of chip visual yield for the dicing method, and FIG. 3B is a graph of chip visual yield for the scribing method. A vertical axis represents chip visual yield (%), and a horizontal axis represents metal layer thickness (μm). Here, a chip is determined as visually defective when the bend near the cut portion of the bonding metal layer, the curl of the bonding metal layer from the multilayer body, the crack in the multilayer body and the like have a prescribed size or larger. The thickness T1 of the p-side electrode 29 on the backside of the substrate 27 is fixed to 0.36 μm, and the thickness T2 of the second bonding metal layer 28 is fixed to 0.42 μm.

First, when the metal layer thickness is only the thickness T1 of the p-side electrode 29, the visual yield is as high as 99% or more. Furthermore, also at thickness T1+T2 where the thickness T2 of the second bonding metal layer 28 is added, the visual yield is kept as high as generally 99%. In the case where the first bonding metal layer 26 is cut only in the Au/AuZn film 26a having a thickness of 0.25 μm and not cut in the Au film 26b because a recess 26c is formed therein, the metal layer thickness is treated as T1+T2+0.25 μm, which is 1.03 μm. The visual yield in this case is generally 98.5%. That is, in the case of dicing, it is preferable that the effective metal layer thickness be generally 1.3 μm or less to keep a visual yield of 90% or more.

Next, in the case where no recess is provided in the first bonding metal layer 26, if the thickness of the Au film 26b is 0.5 μm, T3 is 0.75 μm. Hence, the metal layer thickness T1+T2+T3 is generally 1.53 μm, and the visual yield decreases to generally 76%. In this case, a bonding metal layer of generally 1.53 μm is cut, and hence only approximately 1000 lines can be cut in a 2-inch wafer. In contrast, in this embodiment, approximately 5000 lines can be cut.

As shown in FIG. 3B, when the metal layer thickness is 1.53 μm, the visual yield decreases to generally 45%. In contrast, in this embodiment, when the metal layer thickness is 1.03 μm, the visual yield is generally 97%. More specifically, because the Au film 26b is not cut, a high yield can be kept. To keep a visual yield of 90% or more in chip separation by the scribing method, it is preferable that the metal layer thickness be generally 1.15 μm or less as shown in FIG. 3B. The scribing method has higher mass productivity than the dicing method using a blade. Furthermore, although the kerf loss in the dicing method is as large as e.g. 20 μm, the scribing method can reduce the kerf loss, and hence increase the yield per wafer.

Furthermore, because of the small kerf loss, residues of the Au film in cutting the substrate can be prevented from being attached to the section of the light emitting layer 20. This serves to avoid increasing the reverse leakage current, for instance. That is, poor appearance and characteristics due to chip separation process are prevented, which facilitates yield improvement.

Next, variations of the first embodiment are described.

Figure 4A:
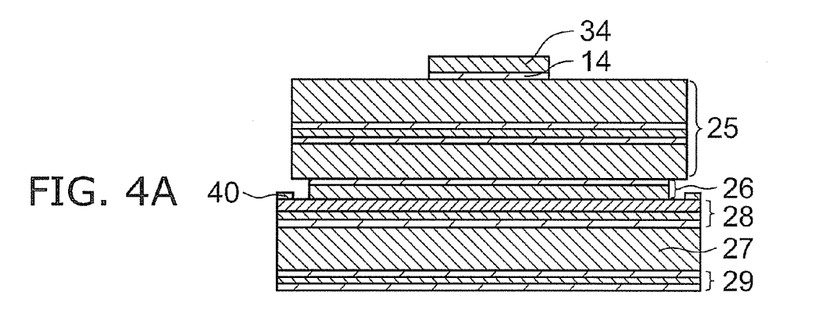
FIGS. 4A to 4C are schematic cross-sectional views of modified example of the first embodiment.
Figure 4B:
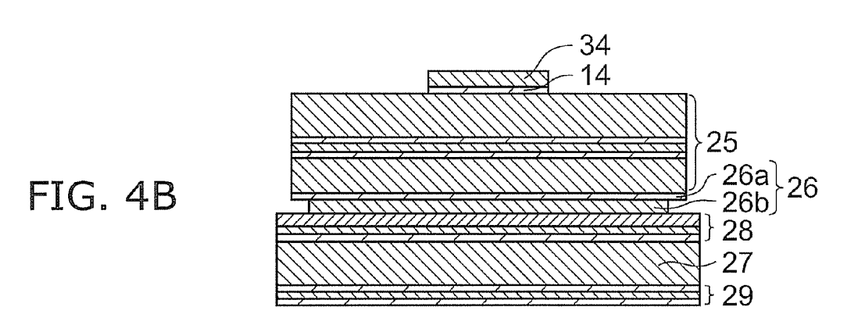
Figure 4C:
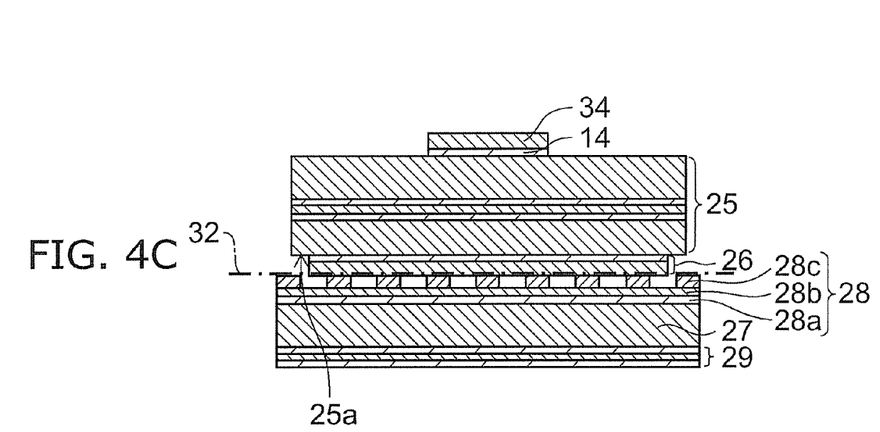

FIG. 4A is a schematic cross-sectional view of a first variation, FIG. 4B is a schematic cross-sectional view of a second variation, and FIG. 4C is a schematic cross-sectional view of a third variation.

In these variations, the multilayer body 25 including the light emitting layer 20 has a smaller planar size than the substrate 27. That is, the outer edge of the multilayer body 25 is located inside the outer edge of the substrate 27. This facilitates avoiding fracture layers due to dicing or scribing near the end portion of the light emitting layer 20. Hence, stable diode characteristics can be obtained.

To realize such configuration, first, a resist is patterned on the wafer surface, and the lateral side of the multilayer body 25 is etched by the RIE (reactive ion etching) method using a chlorine-based gas. Here, preferably, etching is stopped so as to leave the p-type contact layer 24, because it can prevent the Au-based bonding metal layer from being attached to near the sidewall of the light emitting layer 20. Furthermore, the damaged layer resulting from the RIE method is removed using a Br-based solution.

In the first variation shown in FIG. 4A, on the upper surface of the second bonding metal layer 28 provided on the substrate 27, a high-hardness film 40, such as a metal film or dielectric film harder than Au, is patterned near the chip cutting region. This facilitates preventing deformation of the bonding metal layer, such as curls in the chip separation process.

In the second variation shown in FIG. 4B, the Au/AuZn film provided on one surface 25a of the multilayer body 25 is not patterned, but the Au film 26 thereabove is patterned to a reduced planar size.

Furthermore, in the third variation shown in FIG. 4C, the Au film at the surface of the second bonding metal layer 28 provided on the substrate 27 side is patterned into a mesh or island configuration. An island configuration includes a waterdrop or polka-dotted pattern. This can easily prevent deformation, such as curls of the bonding metal layer in chip separation. It can be aligned with the pattern of the first bonding metal layer 26 provided on one surface 25a of the multilayer body 25 by the infrared transmission method or the like.

The third variation illustrates that the bonding metal layer with reduced planar size can be provided on the substrate 27 side. That is, the Au film 28c on the substrate 27 side is thickened and patterned to a reduced planar size. Because the Au film 26b on the multilayer body 25 side can be thinned, curls and bends of the bonding metal layer, cracks in the multilayer body 25 and the like can be prevented.

Figure 5:
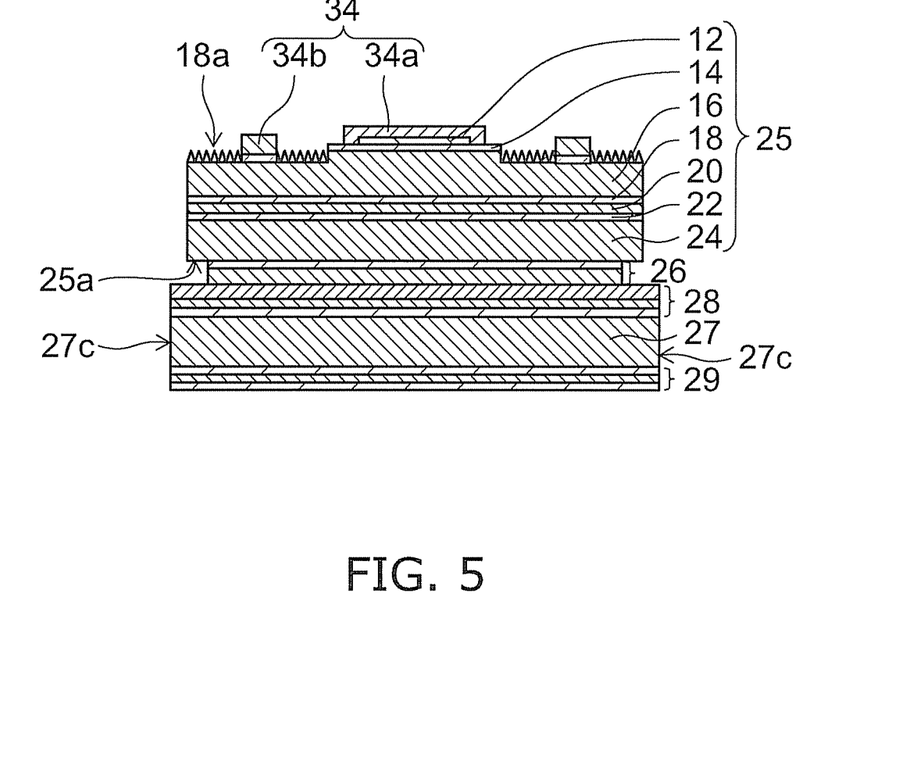
FIG. 5 is a schematic cross-sectional view of a light emitting device according to a second embodiment.

FIG. 5 is a schematic cross-sectional view of a light emitting device according to a second embodiment.

In this embodiment, small inequalities 18a is provided at the light extraction surface on the upper surface of the chip. The small inequalities 18a act as a graded-index (GI) region and can increase the light extraction efficiency.

Furthermore, the n-side electrode 34 includes a pad electrode 34a and a thin wire electrode 34b. A p-type current block layer 12 is provided below the center of the pad electrode 34a to prevent carrier injection.

FIGS. 6A to 6D are process cross-sectional views of a method for manufacturing a light emitting device according to the second embodiment.

Figure 6A:
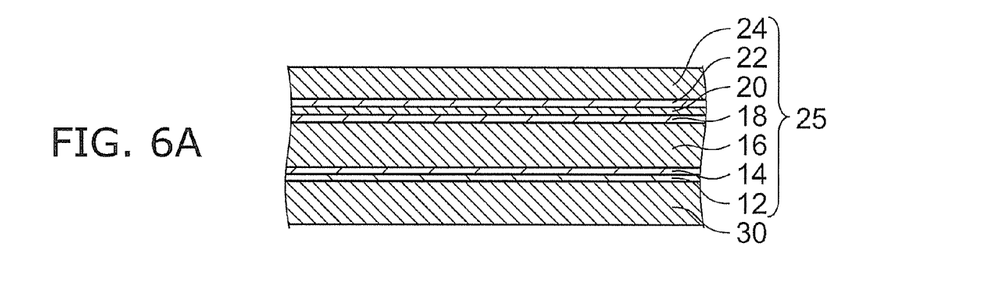
FIGS. 6A to 6D are schematic process cross-sectional views of a method for manufacturing the light emitting device of the second embodiment.
Figure 6B:
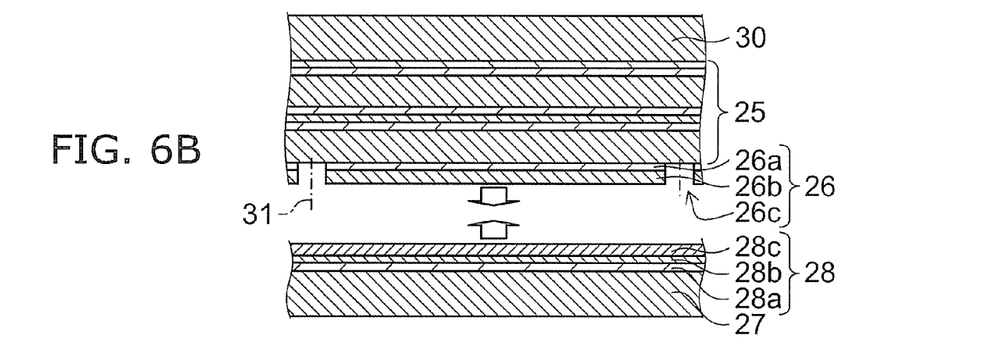

A current block layer 12 made of p-type $In_{0.5}(Ga_{0.3}Al_{0.7})_{0.5}P$ ($2\times10^{17}$ cm$^{-3}$, thickness 0.2 μm) is provided between the crystal growth substrate 30 and the n-type contact layer 14 (FIG. 6A). As in the first embodiment, the first bonding metal layer 26 provided on the surface 25a of the multilayer body 25 and including a recess 26c is joined with the second bonding metal layer 28 provided on the substrate 27, and then they are bonded by pressurized heating (FIG. 6B).

Figure 6C:
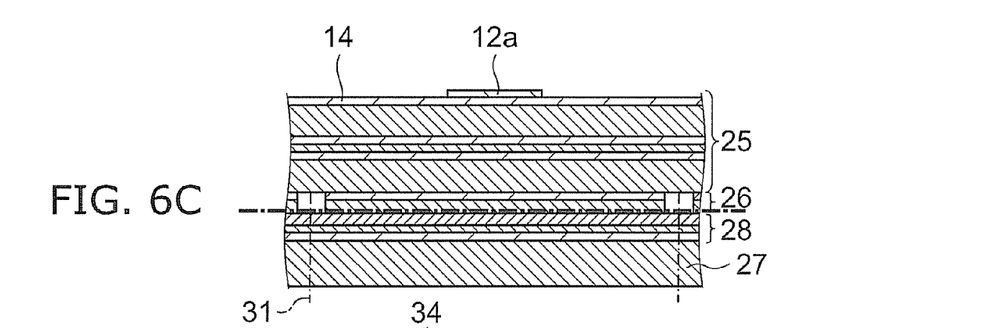
Figure 6D:
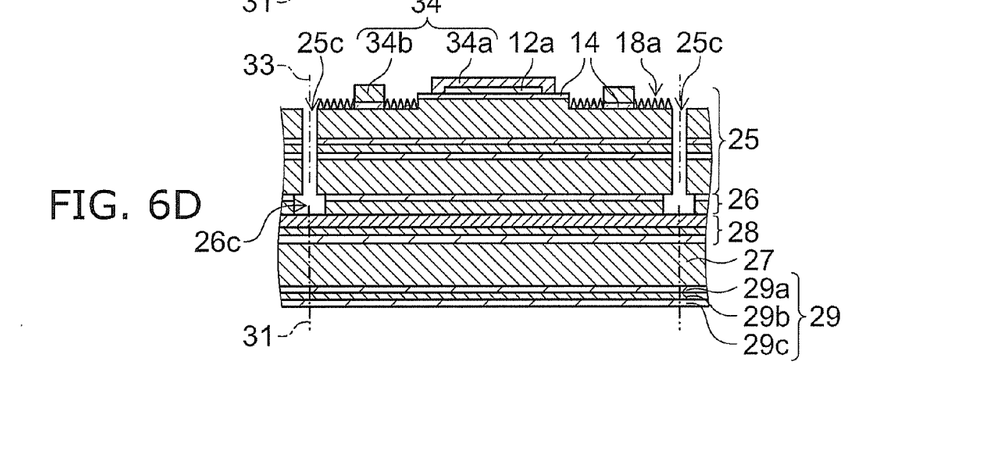

The crystal growth substrate 30 is removed, and a current block layer 12a is patterned on the exposed n-type contact layer 14 (FIG. 6C). An n-side electrode 34 is formed so that the pad portion 34a has a larger planar size than the patterned current block layer 12 and that the thin wire portion 34b is spaced therefrom around the pad portion 34a (FIG. 6D).

Next, a GI region is formed. First, $SiO_2$ is formed on the n-type contact layer 14 by the CVD method. A mask material containing a block copolymer is applied onto $SiO_2$, and annealed at generally 250° C. to separate the microlayer. Polystyrene particles are formed by removing PMMA (polymethyl methacrylate) by RIE using oxygen gas. The polystyrene particles are used as a mask to etch away $SiO_2$ by the RIE method. Next, the cured polystyrene is removed by the RIE method, and the patterned $SiO_2$ is used as a mask to etch the current diffusion layer 16 using the RIE method. Thus, GI shape having protrusions can be formed. The height thereof can illustratively be 0.7 μm.

Next, Ti (0.1 μm)/Pt (0.12 μm)/Au (0.2 μm) is formed on the backside of the substrate 27 as a p-side electrode 29.

Furthermore, the substrate 27 is cut so that the plane passing in the recess 26c and being generally perpendicular to the substrate 27 constitutes a cutting plane 27c. Here, the substrate 27 is easily separated by cutting it using the dicing method so that the plane passing in the recess 26c and being generally perpendicular to the substrate 27 further passes in the spacing region 25c of the multilayer body 25. In this process, the thick Au film 26b is not diced. This serves to avoid bends and curls of the bonding metal layer, and poor appearance and characteristics can be prevented. That is, the yield is improved, and the mass productivity is increased.

The present embodiments provide a light emitting device which facilitates chip production with improved yield, and a method for manufacturing the same with high mass productivity. Such a light emitting device can be widely used in such applications as illumination apparatuses, display apparatuses, and traffic signals.

The embodiments of the invention have been described with reference to the drawings. However, the invention is not limited thereto. Those skilled in the art can variously modify the multilayer body, light emitting layer, substrate, bonding metal layer, electrode and the like constituting the embodiments of the invention, and such modifications are also encompassed within the scope of the invention unless they depart from the spirit of the invention.

The invention claimed is:

1. A light emitting device comprising:
   a multilayer body made of a semiconductor and including a light emitting layer, the multilayer body having a first surface and a second surface opposed to the first surface;
   a first bonding metal layer attached to the multilayer body;
   a substrate having a first surface and a second surface opposed to the first surface of the substrate; and
   a second bonding metal layer attached to the substrate and bonded to the first bonding metal layer at a bonding interface,
   a planar size of a region of the first surface of the multilayer body to which the first bonding metal layer is attached being smaller than a planar size of the first surface of the multilayer body, or a planar size of a region of the first surface of the substrate to which the second bonding metal layer is attached smaller than a planar size of the first surface of the substrate,
   the substrate being made of one of Si, SiC, GaAs, and GaP, and
   the first bonding metal layer being formed in order of Au, AuZn, and Au from the multilayer body side.

2. The light emitting device according to claim 1, wherein the second bonding metal layer includes one of Au, an Au-containing multilayer metal, and an Au-containing eutectic metal.

3. The light emitting device according to claim 1, wherein the substrate is conductive.

4. The light emitting device according to claim 1, further comprising:
   a first electrode provided on the second surface of the substrate.

5. The light emitting device according to claim 4, further comprising:
   a second electrode provided on the second surface of the multilayer body.

6. A light emitting device comprising: claim 2, wherein
   a multilayer body made of a semiconductor and including a light emitting layer, the multilayer body having a first surface and a second surface opposed to the first surface;
   a first bonding metal layer attached to the multilayer body;
   a substrate having a first surface and a second surface opposed to the first surface of the substrate; and
   a second bonding metal layer attached to the substrate and bonded to the first bonding metal layer at a bonding interface,
   a planar size of a region of the first surface of the multilayer body to which the first bonding metal layer is attached being smaller than a planar size of the first surface of the multilayer body, or a planar size of a region of the first surface of the substrate to which the second bonding metal layer is attached being smaller than a planar size of the first surface of the substrate,
   the substrate being made of one of Si, SiC, GaAs, and GaP, and
   the first bonding metal layer being formed in order of Au, AuZn, and eutectic metal including Au from the multilayer body side.

7. The light emitting device according to claim 2, wherein the second bonding metal layer is formed in order of Ti film and Au film from the substrate side.

8. The light emitting device according to claim 7, wherein the second bonding metal layer is formed by sandwiching Pt film between the Ti film and the Au film.

9. A light emitting device comprising:
   a multilayer body made of a semiconductor and including a light emitting layer, the multilayer body having a first surface and a second surface opposed to the first surface;
   a first bonding metal layer attached to the multilayer body;
   a substrate having a first surface and a second surface opposed to the first surface of the substrate; and
   a second bonding metal layer attached to the substrate and bonded to the first bonding metal layer at a bonding interface,
   a planar size of a region of the first surface of the multilayer body to which the first bonding metal layer is attached being smaller than a planar size of the first surface of the multilayer body, or a planar size of a region of the first surface of the substrate to which the second bonding metal layer is attached being smaller than a planar size of the first surface of the substrate, and
   the bonding interface side of the first bonding metal layer or the bonding interface side of the second bonding metal layer being formed into a mesh or island configuration.

10. The light emitting device according to claim 4, wherein total thickness of metal films is 1.3 μm or less in a cutting plane, and the metal films include the first electrode, the first bonding metal layer and the second bonding metal layer.

11. The light emitting device according to claim 5, wherein the second electrode includes a pad electrode and a thin wire electrode connected to the pad electrode and provided around the pad electrode.

12. The light emitting device according to claim 6, wherein the second bonding metal layer includes one of Au, an Au-containing multilayer metal, and an Au-containing eutectic metal.

13. The light emitting device according to claim 12, wherein the second bonding metal layer is formed in order of Ti film and Au film from the substrate side.

14. The light emitting device according to claim 13, wherein the second bonding metal layer is formed by sandwiching Pt film between the Ti film and the Au film.

15. The light emitting devices according to claim 6, wherein the substrate is conductive.

16. The light emitting device according to claim 6, wherein a first electrode is provided on the second surface of the substrate, total thickness of metal films is 1.3 μm or less in a cutting plane, and the metal films include the first electrode, the first bonding metal layer and the second bonding metal layer.

17. The light emitting devices according to claim 9, wherein the substrate is conductive.

18. The light emitting device according to claim 9, wherein a first electrode is provided on the second surface of the substrate, total thickness of metal films is 1.3 μm or less in a cutting plane, and the metal films include the first electrode, the first bonding metal layer and the second bonding metal layer.

* * * * *